US012610678B2

(12) United States Patent
Huang et al.

(10) Patent No.: US 12,610,678 B2
(45) Date of Patent: Apr. 21, 2026

(54) LIGHT EMITTING PANEL

(71) Applicant: AUO Corporation, Hsinchu (TW)

(72) Inventors: Kuo-Hsuan Huang, Hsinchu (TW);
Bo-Ru Jian, Hsinchu (TW)

(73) Assignee: AUO Corporation, Hsinchu (TW)

( * ) Notice: Subject to any disclaimer, the term of this
patent is extended or adjusted under 35
U.S.C. 154(b) by 370 days.

(21) Appl. No.: 18/470,395

(22) Filed: Sep. 19, 2023

(65) Prior Publication Data

US 2024/0145658 A1 May 2, 2024

(30) Foreign Application Priority Data

Oct. 31, 2022 (TW) .................................. 111141298

(51) Int. Cl.
H10H 20/857 (2025.01)
H10W 90/00 (2026.01)

(52) U.S. Cl.
CPC .......... H10H 20/857 (2025.01); H10W 90/00
(2026.01)

(58) Field of Classification Search
CPC . H01L 25/167; H01L 25/0753; H10H 20/857;
H10H 20/8316; H10H 20/832; H10W
90/00

(Continued)

(56) References Cited

U.S. PATENT DOCUMENTS

2011/0180823 A1 7/2011 Usami
2013/0126890 A1* 5/2013 Bedell .................... H10D 86/60
257/E33.071

(Continued)

FOREIGN PATENT DOCUMENTS

CN 209592083 * 11/2019 ........... H01L 25/075
CN 209592083 U 11/2019
(Continued)

OTHER PUBLICATIONS

Light-Tech Electronics, "LED 5mm full color light 4P common
anode 60° direct viewing angle transparent plastic surface light
emitting diode", retrieved Sep. 18, 2023, with English translation
thereof, available at: https://www.ltc.com.tw/Product/Detail?ICODE=
DL5WZ41, pp. 1-5.

(Continued)

*Primary Examiner* — Didarul A Mazumder
(74) *Attorney, Agent, or Firm* — JCIPRNET

(57) ABSTRACT

A light emitting panel includes a driving backplane, light-
emitting diode elements and at least one transparent elec-
trode. The driving backplane has pads and at least one
common electrode. Each of the light-emitting diode ele-
ments has a P-type semiconductor layer, an N-type semi-
conductor layer, a light-emitting layer disposed between the
P-type semiconductor layer and the N-type semiconductor
layer, and a bonding electrode electrically connected to the
N-type semiconductor layer. Bonding electrodes of the light
emitting diode elements are electrically connected to the
pads of the driving backplane, respectively. The bonding
electrode, the N-type semiconductor layer, the light emitting
layer and the P-type semiconductor layer of each of the light
emitting diode elements are sequentially disposed on a
corresponding one of the pads along a direction away from
the driving backplane. The at least one transparent electrode
is disposed on P-type semiconductor layers of the light
emitting diode elements. The at least one transparent elec-
trode is electrically connected to the P-type semiconductor
layers of the light-emitting diode elements and the at least
one common electrode of the driving backplane.

7 Claims, 4 Drawing Sheets

(58) Field of Classification Search
USPC .................................. 257/40, 91; 438/22, 24
See application file for complete search history.

(56) References Cited

U.S. PATENT DOCUMENTS

| | | | |
|---|---|---|---|
| 2015/0317951 A1* | 11/2015 | Genoe ................... | G09G 3/3283 |
| | | | 345/82 |
| 2019/0302917 A1* | 10/2019 | Pan ...................... | H01L 25/0753 |
| 2019/0392751 A1* | 12/2019 | Hsieh ................ | H01L 21/02263 |
| 2020/0052161 A1* | 2/2020 | Wu .................... | H10H 20/8316 |
| 2020/0251638 A1* | 8/2020 | Morris .................... | G06F 3/012 |
| 2020/0294975 A1* | 9/2020 | Xuan ...................... | H10D 86/60 |
| 2021/0057483 A1* | 2/2021 | Ikeda ................... | H10H 20/857 |
| 2021/0074894 A1* | 3/2021 | Chong ................ | H10H 20/852 |
| 2023/0163156 A1* | 5/2023 | Tan ...................... | H10H 29/142 |
| | | | 257/89 |

FOREIGN PATENT DOCUMENTS

| | | |
|---|---|---|
| TW | 201023668 | 6/2010 |
| TW | 1744024 | 10/2021 |

OTHER PUBLICATIONS

Doyouknow.Wiki, "What is the difference between common anode and common cathode of LED light-emitting diodes?", retrieved Sep. 18, 2023, with English translation thereof, available at: https://www.doyouknow.wiki/a/202103/92245.html, pp. 1-16.

* cited by examiner

LIGHT EMITTING PANEL

CROSS-REFERENCE TO RELATED APPLICATION

This application claims the priority benefit of Taiwan application serial no. 111141298, filed on Oct. 31, 2022. The entirety of the above-mentioned patent application is hereby incorporated by reference herein and made a part of this specification.

BACKGROUND

Technical Field

The invention relates to a panel, and in particular, to a light emitting panel.

Description of Related Art

Light-emitting diode display panel includes a driving backplane and a plurality of light-emitting diode elements that are transposed on the driving backplane. Inheriting the characteristics of the light-emitting diode, the light-emitting diode display panel has the advantages of power saving, high efficiency, high brightness and fast response time. In addition, compared with the organic light emitting diode display panel, the light-emitting diode display panel also has the advantages of easy color adjustment, long luminous life, and no image burn-in. Therefore, the light-emitting diode display panel is regarded as the next generation display technology.

The light-emitting diode components used in the light-emitting diode display panel can be divided into horizontal light-emitting diodes and vertical light-emitting diodes. Take the light-emitting diode display panel that applies vertical light-emitting diodes as an example. Generally speaking, connecting electrodes are formed on a N-type semiconductor layer of the vertical light-emitting diodes to electrically connect the vertical light-emitting diodes and the driving backplane. Based on the consideration of forming an ohmic contact, the material of the connecting electrodes is usually made of metal. However, metals are opaque and affect the light-emitting efficiency of the vertical light-emitting diodes.

SUMMARY

The present invention provides a light emitting panel with good performance.

The light emitting panel of the present invention includes a driving backplane, light-emitting diode elements and at least one transparent electrode. The driving backplane has pads and at least one common electrode. Each of the light-emitting diode elements has a P-type semiconductor layer, an N-type semiconductor layer, a light-emitting layer disposed between the P-type semiconductor layer and the N-type semiconductor layer, and a bonding electrode electrically connected to the N-type semiconductor layer. Bonding electrodes of the light emitting diode elements are electrically connected to the pads of the driving backplane, respectively. The bonding electrode, the N-type semiconductor layer, the light emitting layer and the P-type semiconductor layer of each of the light emitting diode elements are sequentially disposed on a corresponding one of the pads along a direction away from the driving backplane. The at least one transparent electrode is disposed on P-type semiconductor layers of the light emitting diode elements. The at least one transparent electrode is electrically connected to the P-type semiconductor layers of the light-emitting diode elements and the at least one common electrode of the driving backplane.

In one embodiment of the present invention, the above pads respectively have a plurality of driving potentials, the at least one common electrode has at least one common potential, and the at least one common potential is higher than the driving potentials.

In one embodiment of the present invention, the above at least one common potential and the driving potentials are all positive potentials.

In one embodiment of the present invention, the above light emitting panel further includes an insulating layer, having an opening overlapping the P-type semiconductor layer, wherein the at least one transparent electrode is disposed on an entity of the insulating layer and on the opening of the insulating layer to be electrically connected to the P-type semiconductor layer.

In one embodiment of the present invention, the above at least one transparent electrode is a transparent electrode, the light-emitting diode elements include a first light-emitting diode element group and a second light-emitting diode element group respectively arranged in a different first area and a second area, and the P-type semiconductor layers of the plurality of light-emitting diode elements of the first light-emitting diode element group and the second light-emitting diode element group are electrically connected to the same transparent electrode.

In one embodiment of the present invention, the above at least one transparent electrode include a first transparent electrode and a second transparent electrode separated from each other, the light-emitting diode elements comprise a first light-emitting diode element group and a second light-emitting diode element group respectively arranged in a different first area and a second area, the P-type semiconductor layers of the plurality of light-emitting diode elements of the first light-emitting diode element group are electrically connected to the first transparent electrode, and the P-type semiconductor layers of the plurality of light-emitting diode elements of the second light-emitting diode element group are electrically connected to the second transparent electrode.

In one embodiment of the present invention, the above first light-emitting diode element group is further away from a signal input area than the second light-emitting diode element group. The driving backplane further includes a first common line and a second common line. The first common line has a first input terminal located at the signal input area and is electrically connected to the first transparent electrode. The second common line has a second input terminal located at the signal input area and is electrically connected to the second transparent electrode. The potential of the first input terminal of the first common line is greater than the potential of the second input terminal of the second common line.

DESCRIPTION OF THE EMBODIMENTS

Figure 1:
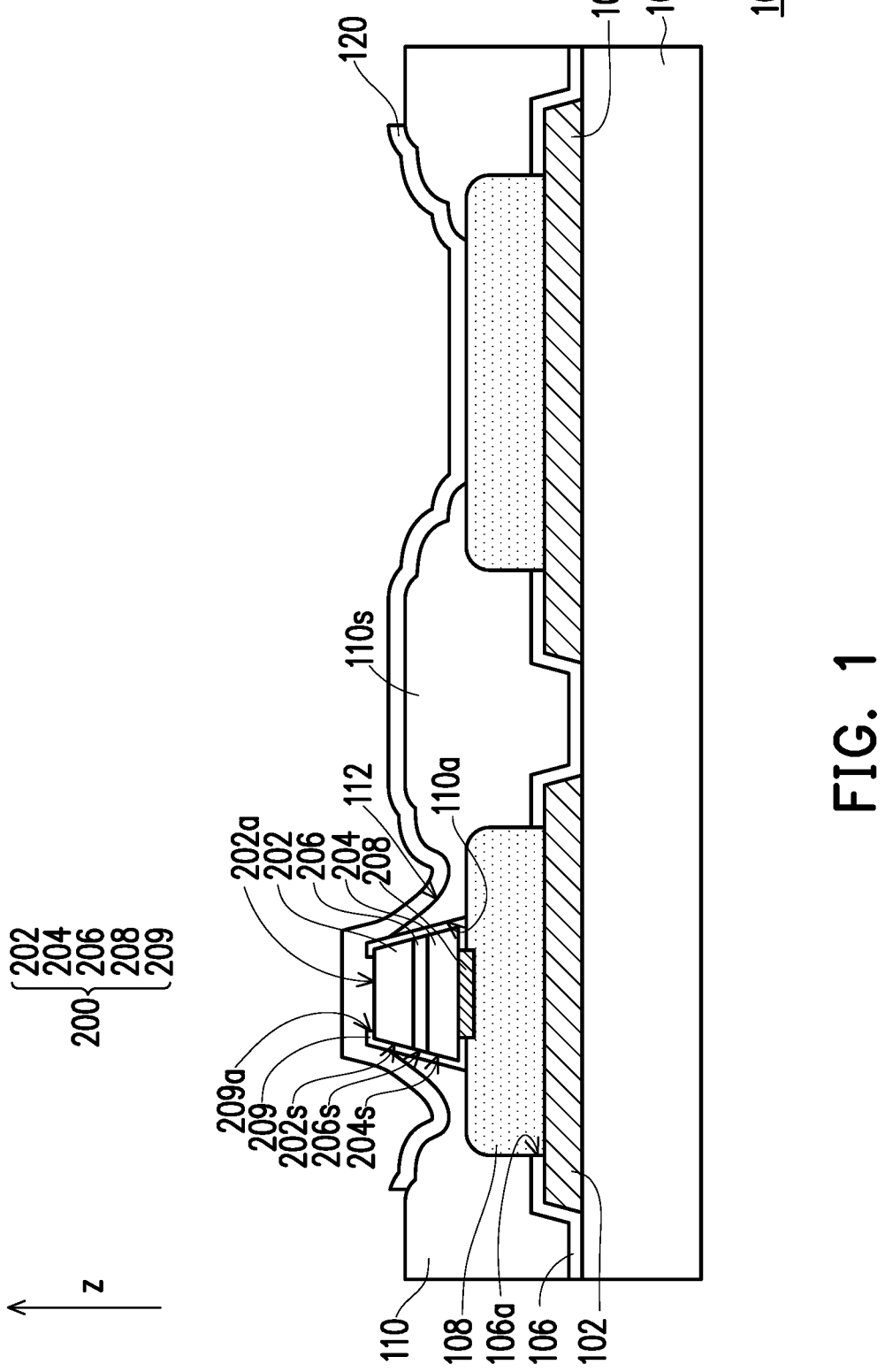
FIG. 1 is a schematic cross-sectional view of a light emitting panel according to an embodiment of the present invention.

Reference will now be made in detail to the exemplary embodiments of the present invention, examples of which are illustrated in the accompanying drawings. Whenever possible, the same reference numbers are used in the drawings and descriptions to refer to the same or similar parts.

It should be understood that when an element such as a layer, film, region or substrate is referred to as being "on" or "connected to" another element, and it may be directly on or connected to another element, or intervening elements may also be present. In contrast, when an element is referred to as being "directly on" or "directly connected to" another element, there are no intervening elements present. As used herein, "connected" may refer to physical and/or electrical connection. Furthermore, "electrically connected" or "coupled" may mean that other elements exist between two elements.

As used herein, "about," "approximately," or "substantially" includes the stated value and an average within an acceptable range of deviations from a particular value as determined by one of ordinary skill in the art, and taking into account the measurements in question and the specific amount of error associated with the measurements (i.e., limitations of the measurement system). For example, "about" may mean within one or more standard deviations of the stated value, or within ±30%, ±20%, ±10%, ±5%. Furthermore, "about", "approximately" or "substantially" used herein can select a more acceptable deviation range or standard deviation according to optical properties, etching properties or other properties, and it is not necessary to use one standard deviation to apply to all properties.

Unless otherwise defined, all terms (including technical and scientific terms) used herein have the same meaning as commonly understood by one of ordinary skill in the art to which the present invention belongs. It will be further understood that terms such as those defined in commonly used dictionaries should be construed to have meanings consistent with their meanings in the context of the relevant technology and the present invention, and are not to be construed as idealistic or excessive formal meaning, unless expressly defined as such herein.

Figure 2:
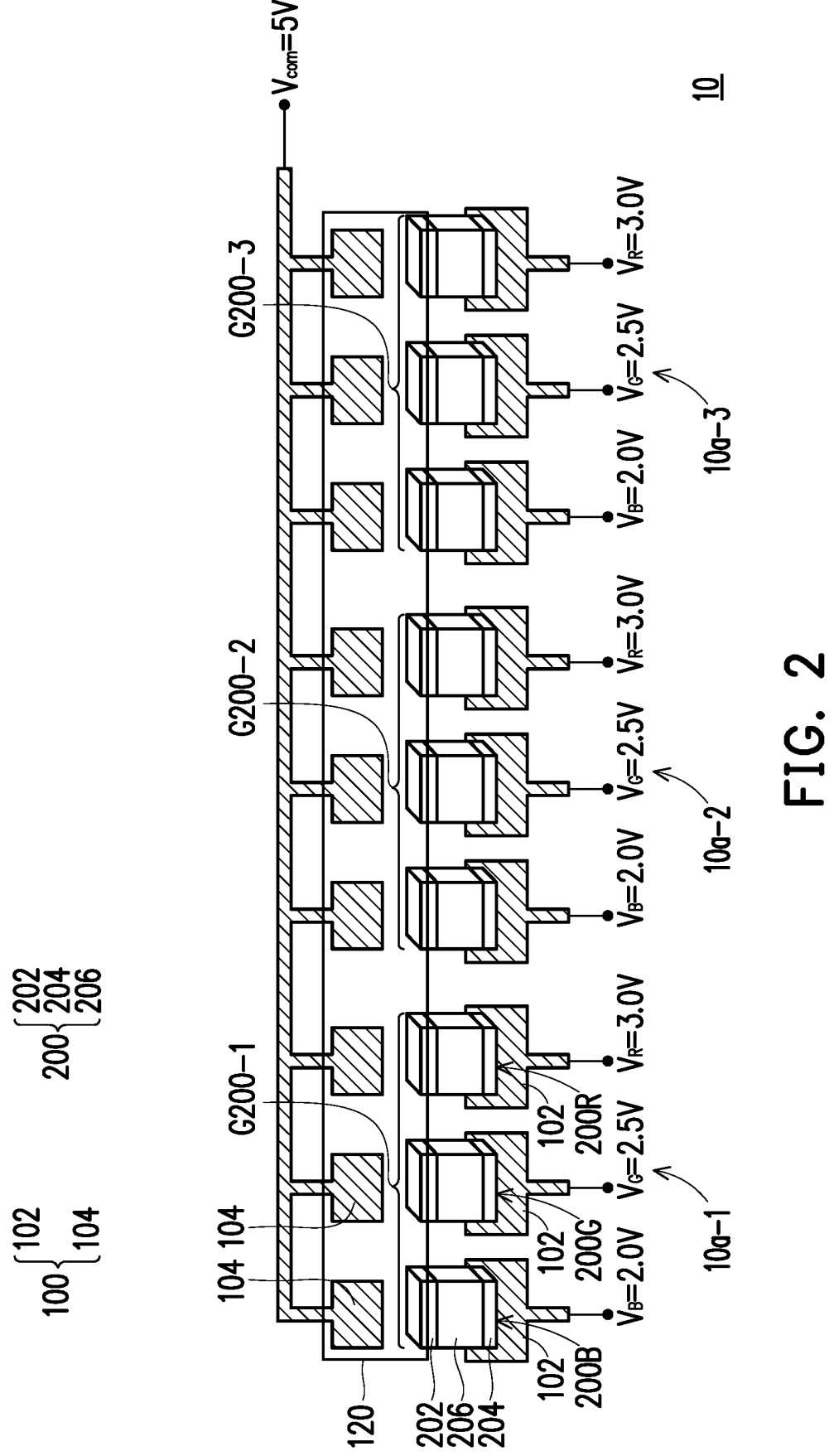
FIG. 2 is a schematic diagram of a light emitting panel according to an embodiment of the present invention.

FIG. 1 is a schematic cross-sectional view of a light emitting panel according to an embodiment of the present invention. FIG. 2 is a schematic diagram of a light emitting panel according to an embodiment of the present invention. FIG. 2 shows transparent electrodes 120, pads 102 and common electrodes 104 of a driving backplane 100, and N-type semiconductor layers 204, light-emitting layers 206 and P-type semiconductor layers 202 of light-emitting diode elements 200, and other components of the light emitting panel 10 are omitted.

Referring to FIG. 1 and FIG. 2, the light emitting panel 10 includes a driving backplane 100. The driving backplane 100 has a plurality of pads 102 and at least one common electrode 104. The pads 102 and the at least one common electrode 104 are structurally separated. In the embodiment, the driving backplane 100 also has a plurality of pixel driving circuits (not shown), each of which is electrically connected to the pads 102. For example, in the embodiment, each pixel driving circuit may include a first transistor (not shown), a second transistor (not shown) and a capacitor (not shown), wherein a first terminal of the first transistor is electrically connected to a corresponding data line (not shown), a control terminal of the first transistor is electrically connected to a corresponding scanning line (not shown), a second terminal of the first transistor is electrically connected to a control terminal of the second transistor, a first terminal of the second transistor is electrically connected to a corresponding power line (not shown), the capacitor is electrically connected to the second terminal of the first transistor and the first terminal of the second transistor, and a second terminal of the second transistor is electrically connected to the pads 102. However, the present invention is not limited thereto, and in other embodiments, the pixel driving circuit may also be other types of circuits.

The light emitting panel 10 further includes a plurality of light-emitting diode elements 200. Each of the light-emitting diode elements 200 has a P-type semiconductor layer 202, an N-type semiconductor layer 204, a light-emitting layer 206 disposed between the P-type semiconductor layer 202 and the N-type semiconductor layer 204, and a bonding electrode 208 electrically connected to the N-type semiconductor layer 204. In the embodiment, based on the consideration of forming ohmic contact, the bonding electrode 208 in contact with the N-type semiconductor layer 204 is made of metal, but the present invention is not limited thereto.

In the embodiment, Each of the light-emitting diode elements 200 may also have a protective layer 209, the protective layer 209 is insulating and covers at least a sidewall 202s of the P-type semiconductor layer 202, a sidewall 204s of the N-type semiconductor layer 204, and a sidewall 206s of the light-emitting layer 206. And the protective layer 209 has an opening 209a overlapping a top surface 202a of the P-type semiconductor layer 202, but the present invention is not limited thereto.

A plurality of the bonding electrodes 208 of the light-emitting diode elements 200 are respectively electrically connected to a plurality of the pads 102 of the driving backplane 100. The bonding electrode 208, the N-type semiconductor layer 204, the light-emitting layer 206 and the P-type semiconductor layer 202 of each of the light-emitting diode elements 200 are sequentially arranged in a direction z away from the driving backplane 100 on a corresponding pad 102.

In the embodiment, the light emitting panel 10 further includes an insulating layer 106, which is disposed on a portion of the pads 102 and has an opening 106a overlapping the pads 102. During the transfer of the light-emitting diode elements 200 to the driving backplane 100, solder (not shown) is provided on the bonding electrode 208 of the light-emitting diode elements 200. The solder contacts the portion of the pad 102 exposed by the opening 106a of the insulating layer 106 to perform a high-temperature eutectic process to further form a eutectic layer 108. Thereby, the bonding electrode 208 of the light-emitting diode elements 200 can be electrically connected to the pads 102 of the driving backplane 100.

In the embodiment, the light emitting panel 10 further includes an insulating layer 110, which is arranged on the insulating layer 106 and the eutectic layer 108. In the embodiment, the insulating layer 110 may also be formed on part of the protective layer 209 of the sidewalls 202s of the P-type semiconductor layer 202, the sidewalls 204s of the N-type semiconductor layer 204, and the side wall 206s of the light-emitting layer 206. And the insulating layer 110 does not cover the top surface 202a of the P-type semiconductor layer 202. In the embodiment, the insulating layer 110 may have a gentle slope section 112 beside the sidewalls 202s of the P-type semiconductor layer 202, the sidewalls 204s of the N-type semiconductor layer 204, and the side wall 206s of the light-emitting layer 206. In the embodiment, the insulating layer 110 may include a first organic insulating layer, an inorganic insulating layer and a second organic insulating layer stacked in sequence, but the present invention is not limited thereto.

The light emitting panel 10 further includes at least one transparent electrode 120 disposed on the P-type semiconductor layers 202 of the light emitting diode elements 200 and electrically connected to the P-type semiconductor layers 202 of the light-emitting diode elements 200 and the at least one common electrode 104 of the driving backplane 100. Specifically, in the embodiment, the insulating layer 110 has an opening 110a overlapping the P-type semiconductor layer 202. The at least one transparent electrode 120 is disposed on the body 110s of the insulating layer 110 and the opening 110a of the insulating layer 110 to be electrically connected to the P-type semiconductor layer 202 of the light-emitting diode elements 200. In the embodiment, the gentle slope section 112 of the insulating layer 110 helps the transparent electrode 120 to form well on the P-type semiconductor layer 202 of the light-emitting diode elements 200, so that it is not easily disconnected due to the height difference between the light-emitting diode elements 200 and the insulating layer 110.

In the embodiment, the material of the transparent electrode 120 can be metal oxide, such as indium tin oxide, indium zinc oxide, aluminum tin oxide, aluminum zinc oxide, indium germanium zinc oxide, or other suitable oxides, or a stacked layer of at least two of the above, but the present invention is not limited thereto.

It should be noted that, the bonding electrode 208, the N-type semiconductor layer 204, the light-emitting layer 206 and the P-type semiconductor layer 202 of each of the light-emitting diode elements 200 are sequentially arranged in the direction z away from the driving backplane 100 on the pads 102 of the driving backplane 100. That is to say, the P-type semiconductor layer 202 of each of the light-emitting diode elements 200 is facing upward, and the P-type semiconductor layer 202 of the light-emitting diode elements 200 share the same transparent electrode 120. The light beam emitted by the light-emitting diode elements 200 can be utilized through the transparent electrode 120 provided on the P-type semiconductor layer 202, which helps to reduce the light loss inside the light emitting panel 10.

In addition, since the P-type semiconductor layers 202 of the light-emitting diode elements 200 share the same transparent electrode 120, the formation area of the transparent electrode 120 is larger, which is helpful for etching and forming of the transparent electrode 120, reducing the resistance of the transparent electrode 120, and improving current resistance.

Referring to FIG. 1 and FIG. 2, in the embodiment, the pads 102 have a plurality of driving potentials VB, VG, VR respectively. The common electrode 104 has a common potential Vcom, and the common potential Vcom is higher than the driving potentials VB, VG, VR. In the embodiment, the common potential Vcom and the driving potentials VB, VG, VR are all positive potentials.

For example, in the embodiment, the light-emitting diode elements 200 of the light emitting panel 100 include a first light-emitting diode element group G200-1, a second light-emitting diode element group G200-2, and a third light-emitting diode element group G200-3 disposed in a different first area 10a-1, a second area 10a-2 and a third areas 10a-3. Each group of the first light-emitting diode element group G200-1, the second light-emitting diode element group G200-2, and the third light-emitting diode element group G200-3 may include a plurality of the light-emitting diode elements 200B, 200G, 200R respectively used to emit different colors of light (such as blue light, green light and red light). Wherein, the pads 102 electrically connected to the light-emitting diode elements 200B, 200G, 200R respectively have a plurality of driving potentials VB, VG, VR, and the driving potentials VB, VG, VR are, for example, respectively 2.0V, 2.5V, 3.0V. In the embodiment, the P-type semiconductor layers 202 of the first light-emitting diode element group G200-1, the second light-emitting diode element group G200-2, and the third light-emitting diode element group G200-3 disposed in a different first area 10a-1, a second area 10a-2 and a third areas 10a-3 may be selectively electrically connected to the same transparent electrode 120. The common potential Vcom of the common electrodes 104 electrically connected to the same transparent electrode 120 is, for example, 5.0V, but the present invention is not limited thereto.

It must be noted here that the following embodiments use the component numbers and part of the content of the previous embodiments, wherein the same numbers are used to denote the same or similar components, and descriptions of the same technical content are omitted. For descriptions of omitted parts, reference may be made to the foregoing embodiments and will not be repeated in the following embodiments.

Figure 3:
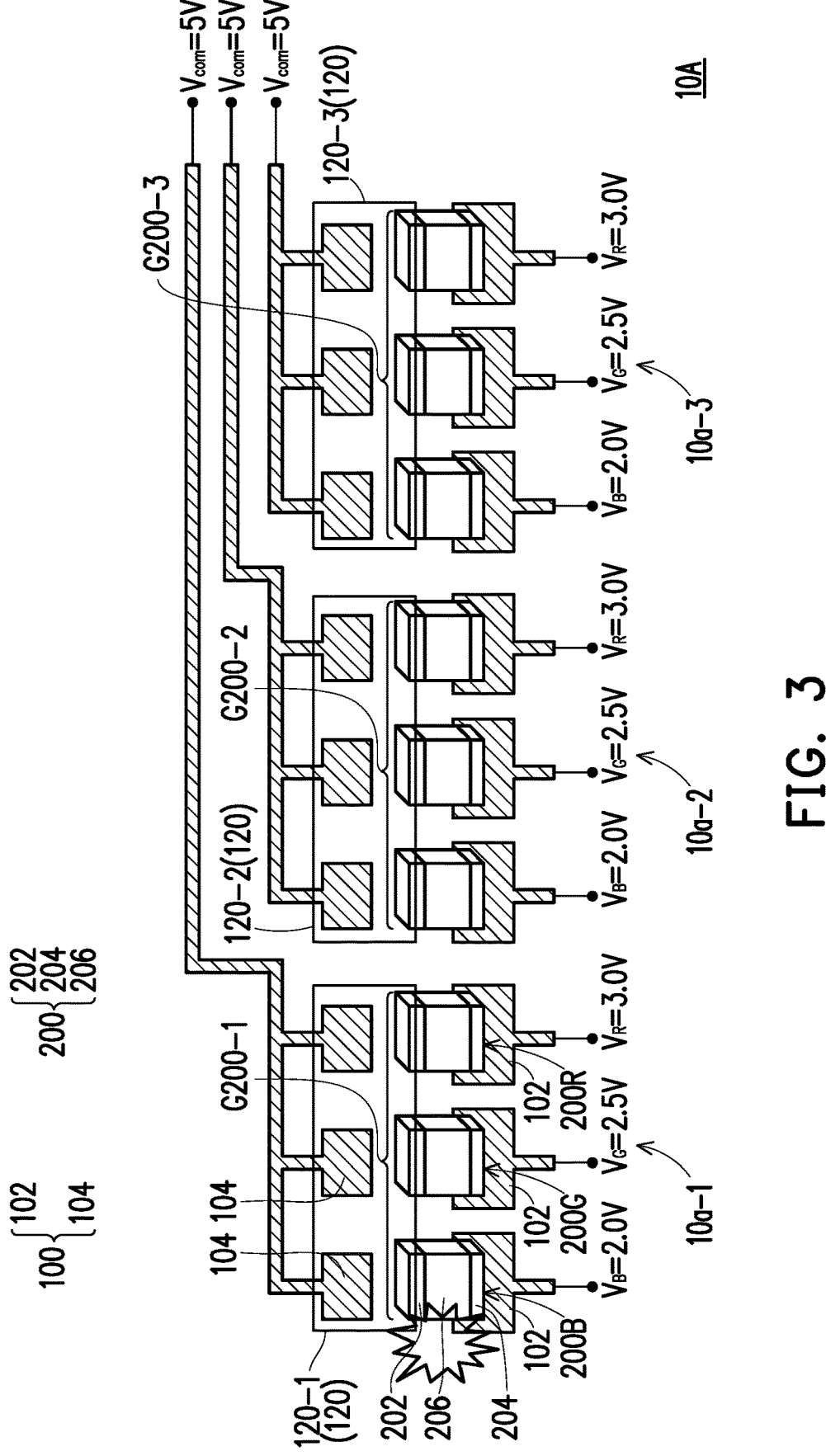
FIG. 3 is a schematic diagram of a light emitting panel according to another embodiment of the present invention.

FIG. 3 is a schematic diagram of a light emitting panel according to another embodiment of the present invention. FIG. 3 shows the transparent electrode 120, and the pads 102 and the common electrodes 104 of the driving backplane 100, and the N-type semiconductor layer 204, the light-emitting layer 206, and the P-type semiconductor layer 202 of the light-emitting diode elements 200, and other components of the light emitting panel 10A are omitted.

The light emitting panel 10A of FIG. 3 is similar to the light emitting panel 10 mentioned above, and the differences between the two are as follows. Referring to FIG. 3, in the embodiment, the at least one transparent electrode 120 may include a first transparent electrode 120-1, a second transparent electrode 120-2 and a third transparent electrode 120-3 that are separated from each other. The light-emitting diode elements 200 may include a first light-emitting diode element group G200-1, a second light-emitting diode element group G200-2, and a third light-emitting diode element group G200-3 disposed in a different first area 10a-1, a second area 10a-2 and a third areas 10a-3. The P-type semiconductor layers 202 of the light-emitting diode elements 200 of the first light-emitting diode element group G200-1 are electrically connected to the first transparent electrode 120-1, the P-type semiconductor layers 202 of the light-emitting diode elements 200 of the second light-emitting diode element group G200-2 are electrically connected to the second transparent electrode 120-2, and the P-type semiconductor layers 202 of the light-emitting diode elements 200 of the third light-emitting diode element group G200-3 are electrically connected to the third transparent electrode 120-3. In the embodiment, if any of the light-emitting diode elements 200 is short-circuited, it will only cause the corresponding area to be a dark area, and will not easily affect the operation of the entire light-emitting panel 10.

Figure 4:
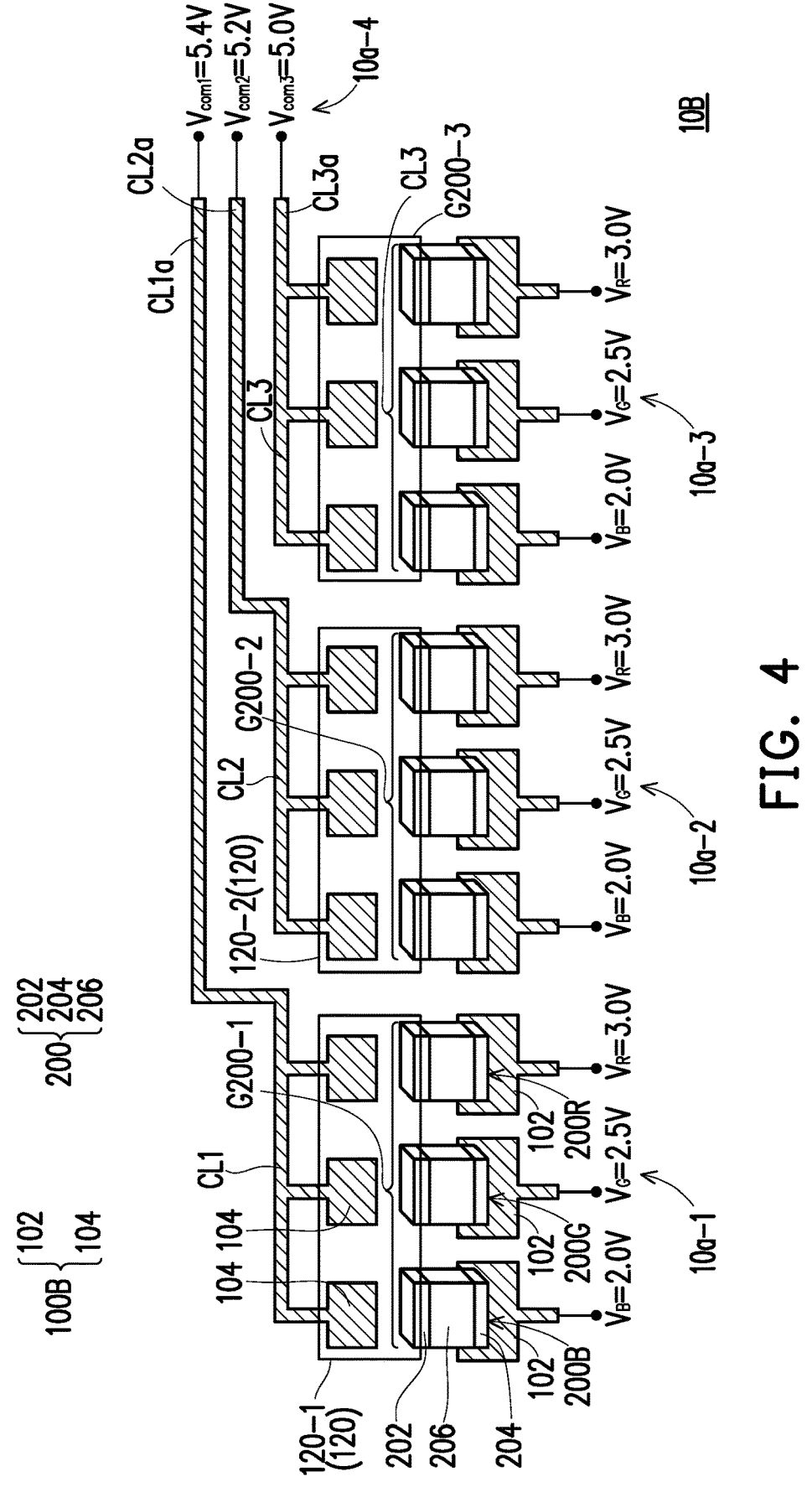
FIG. 4 is a schematic diagram of a light emitting panel according to another embodiment of the present invention.

FIG. 4 is a schematic diagram of a light emitting panel according to another embodiment of the present invention. FIG. 4 shows the transparent electrode 120, and the pads 102, a first common line CL1, a second common line CL2, a third common line CL3, and the common electrode 104 of the driving backplane 100, and the N-type semiconductor layer 204, the light-emitting layer 206, and the P-type semiconductor layer 202 of the light-emitting diode elements 200, and other components of the light emitting panel 10B are omitted.

The light emitting panel 10B of FIG. 4 is similar to the light emitting panel 10A mentioned above, and the differences between the two are as follows. Referring to FIG. 4, in the embodiment, the first light-emitting diode element group G200-1 is farther away from a signal input area 10a-4 than the second light-emitting diode element group G200-2, the second light-emitting diode element group G200-2 is farther away from the signal input area 10a-4 than the third light-emitting diode element group G200-3. The driving backplane 100B includes a first common line CL1, a second common line CL2, and a third common line CL3. The first common line CL1 is electrically connected to a first transparent electrode 120-1 and has a first input terminal CL1a located in the signal input area 10a-4, the second common line CL2 is electrically connected to a second transparent electrode 120-2 and has a second input terminal CL2a located in the signal input area 10a-4, and the third common line CL3 is electrically connected to a third transparent electrode 120-3 and has a third input terminal CL3a located in the signal input area 10a-4. The potential Vcom1 of the first input terminal CL1a of the first common line CL1 is greater than the potential Vcom2 of the second input terminal CL2a of the second common line CL, and the potential Vcom2 of the second input terminal CL2a of the second common line CL2 is greater than the potential Vcom3 of the third input terminal CL3a of the third common line CL3. Accordingly, the first light-emitting diode element group G200-1, the second light-emitting diode element group G200-2, and the third light-emitting diode element group G200-3 at different distances from the signal input area 10a-4 can be compensated for the brightness difference caused by the different lengths/resistances of the first common line CL1, the second common line CL2 and the third common line CL3.

What is claimed is:

1. A light emitting panel, comprising:
a driving backplane having a plurality of pixel driving circuits, a plurality of pads and at least one common electrode, wherein the plurality of pixel driving circuits are electrically connected to the plurality of pads, and the plurality of pads and the at least one common electrode are separated from each other;
a plurality of light-emitting diode elements, wherein each of the plurality of light-emitting diode elements has a P-type semiconductor layer, an N-type semiconductor layer, a light-emitting layer disposed between the P-type semiconductor layer and the N-type semiconductor layer, and a bonding electrode electrically connected to the N-type semiconductor layer, bonding electrodes of the plurality of light emitting diode elements are electrically connected to the plurality of pads of the driving backplane respectively, and the bonding electrode, the N-type semiconductor layer, the light emitting layer and the P-type semiconductor layer of each of the plurality of light emitting diode elements are sequentially disposed on a corresponding one of the plurality of pads along a direction away from the driving backplane; and at least one transparent electrode disposed on the P-type semiconductor layers of the plurality of light emitting diode elements and electrically connected to the P-type semiconductor layer of the plurality of light-emitting diode elements and the at least one common electrode of the driving backplane.

2. The light emitting panel according to claim 1, wherein the plurality of pads respectively has a plurality of driving potentials, the at least one common electrode has at least one common potential, and the at least one common potential is higher than the plurality of driving potentials.

3. The light emitting panel according to claim 2, wherein the at least one common potential and the plurality of driving potentials are all positive potentials.

4. The light emitting panel according to claim 1, further comprises:
an insulating layer having an opening overlapping the P-type semiconductor layer, wherein the at least one transparent electrode is disposed on an entity of the insulating layer and on the opening of the insulating layer to be electrically connected to the P-type semiconductor layer.

5. The light emitting panel according to claim 1, wherein the at least one transparent electrode is a transparent electrode, the plurality of light-emitting diode elements comprise a first light-emitting diode element group and a second light-emitting diode element group respectively arranged in a first area and a second area, and the P-type semiconductor layers of the plurality of light-emitting diode elements of the first light-emitting diode element group and the second light-emitting diode element group are electrically connected to the transparent electrode.

6. The light emitting panel according to claim 1, wherein the at least one transparent electrode comprise a first transparent electrode and a second transparent electrode separated from each other, the plurality of light-emitting diode elements comprise a first light-emitting diode element group and a second light-emitting diode element group respectively arranged in a first area and a second area, the P-type semiconductor layers of the plurality of light-emitting diode elements of the first light-emitting diode element group are electrically connected to the first transparent electrode, and the P-type semiconductor layers of the plurality of light-emitting diode elements of the second light-emitting diode element group are electrically connected to the second transparent electrode.

7. The light emitting panel according to claim 6, wherein the first light-emitting diode element group is further away from a signal input area than the second light-emitting diode element group, the driving backplane further comprises:
a first common line having a first input terminal located at the signal input area and electrically connected to the first transparent electrode; and
a second common line having a second input terminal located at the signal input area and electrically connected to the second transparent electrode;
wherein the potential of the first input terminal of the first common line is greater than the potential of the second input terminal of the second common line.

* * * * *